United States Patent [19]

Denes

[11] Patent Number: 5,220,488
[45] Date of Patent: Jun. 15, 1993

[54] INJECTION MOLDED PRINTED CIRCUITS

[75] Inventor: Oscar L. Denes, Greendale, Wis.

[73] Assignee: UFE Incorporated, Stillwater, Minn.

[21] Appl. No.: 875,561

[22] Filed: Apr. 27, 1992

Related U.S. Application Data

[63] Continuation of Ser. No. 425,656, Oct. 23, 1989, abandoned, which is a continuation-in-part of Ser. No. 71,267, Jul. 1, 1987, Pat. No. 4,912,288.

[30] Foreign Application Priority Data

Sep. 4, 1985 [GB] United Kingdom ............... 8522003
May 19, 1986 [GB] United Kingdom ............... 8612116

[51] Int. Cl.$^5$ ..................... H05K 3/02; H05K 1/03
[52] U.S. Cl. .................................. 361/398; 29/846;
29/848; 29/849; 174/254; 174/255; 174/256;
174/261; 361/397; 361/402; 361/409; 361/411
[58] Field of Search .................... 29/846, 848, 849;
174/250, 254, 255, 256, 257, 258, 261;
228/180.1, 180.2; 357/80; 361/397, 398, 402,
406, 408, 409, 411; 439/77

[56] References Cited

U.S. PATENT DOCUMENTS

| | | | |
|---|---|---|---|
| 2,692,190 | 10/1954 | Pritkin | 41/42 |
| 2,972,003 | 2/1961 | Greenman et al. | 174/254 |
| 3,024,151 | 3/1962 | Robinson | 156/150 |
| 3,039,177 | 6/1962 | Burdett | 29/155.5 |
| 3,077,658 | 2/1963 | Wharton | 29/155.5 |
| 3,161,945 | 12/1964 | Anderson et al. | 29/155.5 |
| 3,181,986 | 5/1965 | Pritikin | 156/233 |
| 3,427,715 | 2/1969 | Mika | 361/398 |
| 3,622,384 | 11/1971 | Davey et al. | 117/212 |
| 3,678,577 | 7/1972 | Weglin et al. | 29/625 |
| 4,050,976 | 9/1977 | Reiters | 156/233 |
| 4,301,580 | 11/1981 | Wallace | 29/25.12 |
| 4,369,557 | 1/1983 | Vandebult | 29/25.42 |
| 4,402,135 | 9/1983 | Schweingruber et al. | 174/255 |
| 4,407,685 | 10/1983 | Hankland | 156/212 |
| 4,415,607 | 11/1983 | Denes | 427/96 |
| 4,495,546 | 1/1985 | Nakamura et al. | 361/398 |
| 4,533,787 | 8/1985 | Anderegg et al. | 174/254 |
| 4,535,012 | 8/1985 | Martin et al. | 427/386 |
| 4,584,767 | 4/1986 | Gregory | 29/848 |
| 4,591,220 | 5/1986 | Impey | 361/414 |
| 4,710,419 | 12/1987 | Gregory | 428/210 |
| 4,811,081 | 3/1989 | Lyden | 357/80 |
| 5,114,796 | 5/1992 | Frentzel et al. | 428/521 |

FOREIGN PATENT DOCUMENTS

| | | | |
|---|---|---|---|
| 0101095 | 2/1984 | European Pat. Off. | |
| 0424796 | 5/1991 | European Pat. Off. | 439/77 |
| 1243746 | 7/1967 | Fed. Rep. of Germany | |
| 2447653 | 4/1976 | Fed. Rep. of Germany | 174/254 |
| 3302857 | 8/1984 | Fed. Rep. of Germany | 361/398 |
| 0067998 | 6/1977 | Japan | 29/846 |
| 398734 | 9/1965 | Switzerland | 361/398 |
| 656259 | 8/1951 | United Kingdom | |
| 715207 | 9/1954 | United Kingdom | |
| 738265 | 10/1956 | United Kingdom | |
| 822826 | 11/1959 | United Kingdom | |
| 883872 | 12/1961 | United Kingdom | |
| 984250 | 2/1965 | United Kingdom | |
| 1167403 | 10/1969 | United Kingdom | |
| 1249659 | 10/1971 | United Kingdom | 29/846 |
| 88/06064 | 8/1988 | World Int. Prop. O. | 361/401 |

OTHER PUBLICATIONS

IBM Technical Disclosure Bulletin, vol. 7 No. 6 Nov., 1964 G. C. Feth.
IBM Technical Disclosure Bulletin vol 14 No. 11 Apr., 1972.
IBM Technical Disclosure Bulletin dated Aug., 1961.

*Primary Examiner*—Leo P. Picard
*Assistant Examiner*—D. Sparks
*Attorney, Agent, or Firm*—Quarles & Brady

[57] ABSTRACT

An electrical circuit package wherein a flexible support member having conductive materials and electronic components thereon is fused with a substrate which acts as a support for the film. This results in a unitary packaged circuit. In one embodiment the film is a decal on which certain portions have a substrate fused thereto. In other embodiments, various layers of conductive materials are applied and molded into the substrate to form a variety of electronic functions. The circuit package lends itself to high production and reliability as well as cost savings.

5 Claims, 4 Drawing Sheets

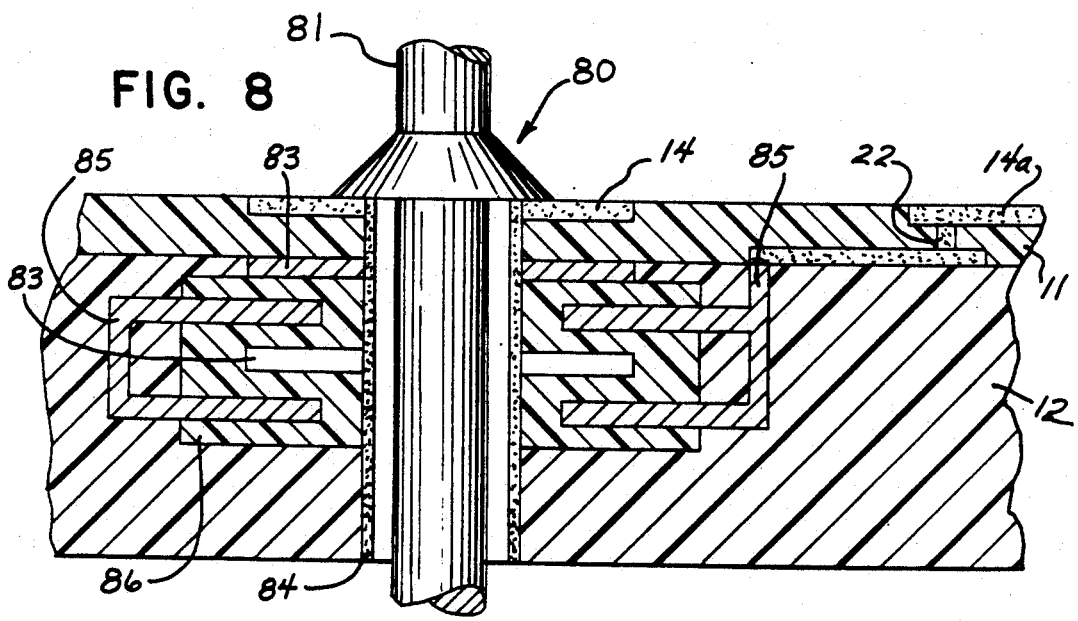
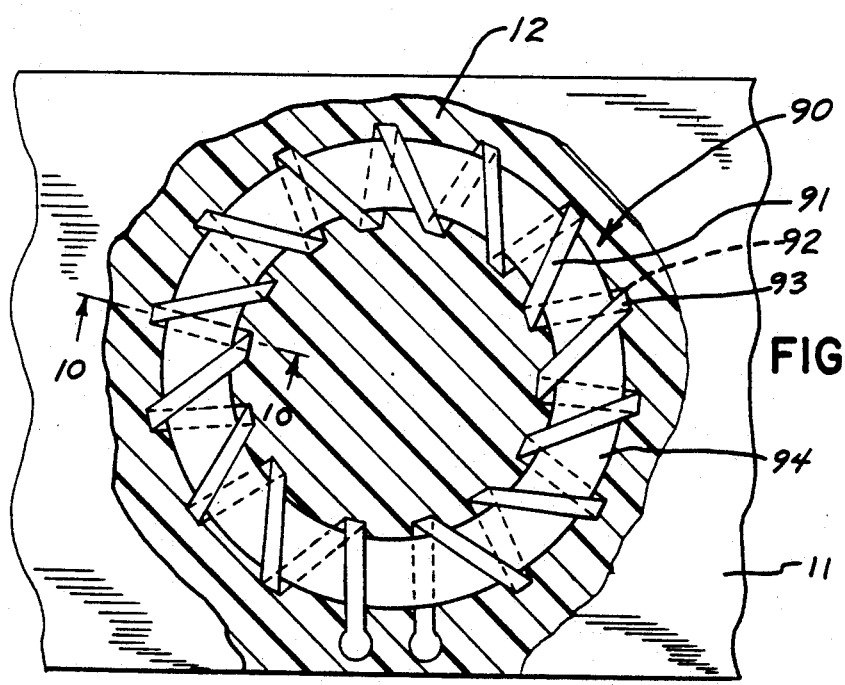
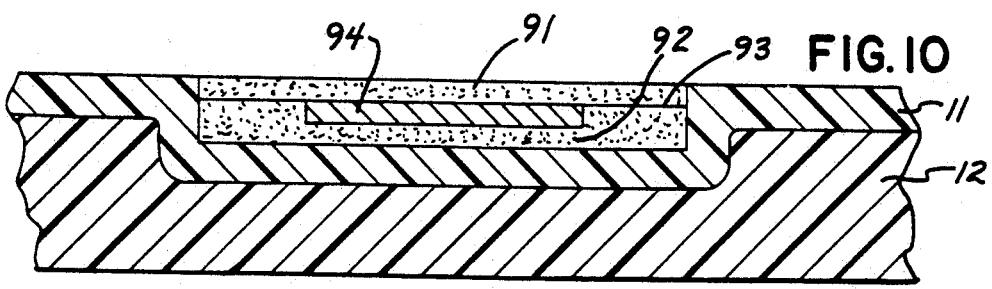

INJECTION MOLDED PRINTED CIRCUITS

CROSS-REFERENCE TO RELATED APPLICATIONS

This application is a continuation of application Ser. No. 07/425,656, filed Oct. 23, 1989, which is a continuation-in-part of Ser. No. 07/071,267 filed Jul. 1, 1987, now U.S. Pat. No. 4,912,288.

BACKGROUND OF THE INVENTION

The field of invention is electrical circuit packages, and particularly, electrical circuit packages which have conductive material and components on a flexible support member with the support member being integrally molded with a plastic substrate material.

In U.S. Pat. No. 2,972,003, there is disclosed a circuit assembly wherein a circuit pattern is die stamped from a metal foil and adhesively secured to a fibrous base. The circuit pattern is subsequently molded into the base. In one embodiment there are three fibrous bases sandwiched together.

There is known in the electronic art to provide printed circuit boards wherein electronic components are mounted on insulating substrates. Such methods of making printed circuits are described in U.S. Pat. Nos. 2,692,190 and 3,181,986. In U.S. Pat. No. 2,692,190, a temporary base sheet is employed on which is placed a conductive material utilizing a photo-sensitive coating process as well as an etching step. A copper sheet is used as a temporary base which is etched away leaving the conductive material in a base of insulating material. In U.S. Pat. No. 3,181,986 a metal film with the circuit is stripped from a base of insulating material leaving the circuit material in the base.

Another well known product of this general type employs fiberglass laminated substrates. This involves the interconnection of the mounted components by conductive traces such as copper which are etched onto the board surface. This is a time consuming and labor intensive task in that a typical board would require plating, etching, drilling and cutting. Once a standard board is complete, retainer clips, sockets and standoffs must be added. The problems which are inherent to the fiberglass laminate substrate include warpage, poor dimensional stability, low glass transition, temperature and limited electrical properties. Printed circuit board production also can create physical and chemical wastes which must be recovered or disposed.

Modern, so-called "engineering plastics", are increasingly being used as parts, sub-assemblies or structural members in all kinds of manufactured goods; such as motor cars, aircraft, "white" goods, and telecommunications equipment. There is often a requirement to incorporate an electrical circuit on such parts and, hitherto, this has been achieved by printing, bonding or otherwise applying the circuit onto the surface of such parts to effectively produce a "printed" circuit on an external surface of a three-dimensional object. The printed circuit may include integrally formed resistors, capacitors and inductors and may also have other devices added to the circuit.

It is also known to utilize a decal or temporary support base for a printed circuit which is transferred to the permanent substrate. An example of this type of process is indicated in U.S. Pat. No. 4,415,607 as well as U.S. Pat. Nos. 4,050,976; 4,301,580 and 4,407,685. Basically, the process described in U.S. Pat. No. 4,415,607 is referred to as the transfer decal method and involves the printing of a circuit onto a film such as Mylar. The decal is inserted into a mold die with the circuitry inverted. After injection molding, the decal is removed, exposing the circuitry which has been transferred into the substrate material. The final product offers embedded circuit traces which are flush with the substrate surface.

There is a need, however, for a molded circuit board which would involve fewer processing steps and result in an overall cost saving. It would provide for holes, standoffs and numerous other physical features which could be molded into the circuit board eliminating the need for drilling, cutting and additional hardware placement. As a decal is involved it is flexible, and can conform to a three dimensional surface created during the molding process. This gives a true three-dimensional molding process. This offers the advantage of uniform placing of components and flexible backing which assists in handling and high speed production. Such a product is provided in the product of this invention.

SUMMARY OF THE INVENTION

The present invention provides in one embodiment for a circuit to be placed on flexible support material with an electrical component unitarily disposed on the support material and having at least two layers of conductive material. In this manner an electrical component such as a capacitor, filter or an inductor can be provided. The support material is subsequently molded or captured into a substrate material to form an integral electronic package. This particular method avoids the disadvantages of the previously referred to etching process. It also allows for the advantages of the decal process while obviating a disadvantage thereof which is in the removal of the flexible decal support member.

In another aspect of the invention, there are at least two substrate material portions fused directly to portions of the support member in a manner to form a hinged structure between the substrate material.

A general object of the invention is to provide an electrical circuit package wherein the desired circuitry and components can be printed at a high rate on a flexible support member with the flexible support member then becoming an integral part of the substrate and the electrical package.

Another object of the invention is to provide an integral electronic component package wherein multiple layers of conductive materials can be molded into the integral circuit package.

Still another object is in providing two-sided circuitry on a single flexible substrate as well as laser or other means of drilling through the substrate for connection between the opposing two-sided circuits.

Yet another object of the invention is to provide a flexible substrate in the decal form which can be printed with various components and molded with separated substrate portions to afford a hinging effect between the separated substrate portions. This provides versatility in the type of electronic package produced and a three-dimensional packaging effect.

A still more specific object is in providing a pre-printed circuit in an integrally molded package wherein the substrate materials can be molded in a curved configuration.

Other objects are an electrical circuit package of the foregoing type which allows for alterations in circuitry without incurring a major tooling expense, the ability to select materials of choice and having the circuitry embedded into the molded component of various geometric configurations.

The foregoing and other objects and advantages of the invention will appear from the following description. In the description reference is made to the accompanying drawings which form a part thereof, and in which there is shown by way of illustration, preferred embodiments of the invention. Such embodiments do not necessarily represent the full scope of the invention, however, and reference is therefore made to the claims herein for interpreting the scope of the invention.

BRIEF DESCRIPTION OF THE DRAWINGS

FIG. 8 is a view similar to FIG. 7 showing a filter molded in the printed circuit package of this invention.

FIG. 9 is a top plan view showing an inductor embedded in the circuit package of this invention.

FIG. 10 is a section view taken along line 10—10 of FIG. 9.

DESCRIPTION OF THE PREFERRED EMBODIMENTS

Figure 1:
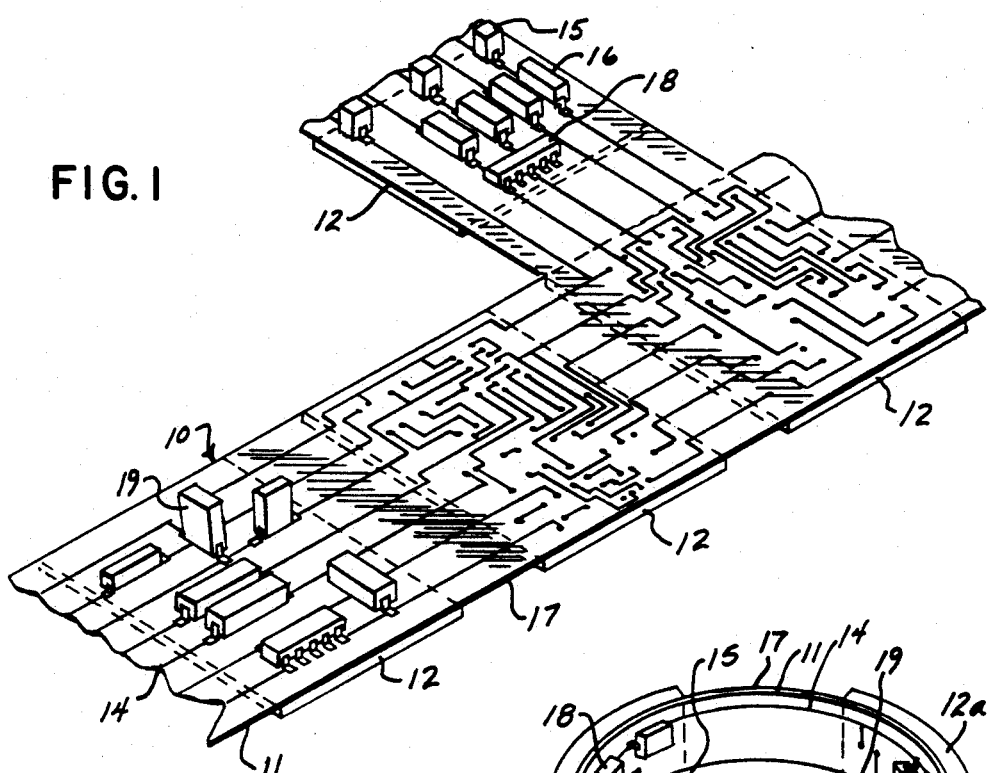
FIG. 1 is a top plan view of an injection molded printed circuit package of this invention.

Referring first of FIG. 1, there is shown the molded printed circuit package generally 10 which is fabricated from a flexible film material 11, preferably Ultem resin which is a polyetherimide resin manufactured by General Electric Co. The film is fused to a rigid substrate material 12 which in this instance is preferably also Ultem resin. The procedure for fabricating the circuit package 10, as well as the other embodiments, will be described later in conjunction with FIGS. 11-16. On the film 11 is printed an electrically conductive trace material 14 to which is electrically connected the various electronic components such as the transistors 15, the resistors 16, the dual inline network 18 and the capacitors 19. This particular embodiment 10, as well as those shown generally at 20, 30, 40, 50 and 60, provide a "fix-flex" feature because of the rigid substrate 12 affording a "fixing" of the film 11 in the area where it is fused with the substrate 12 and a "flex" or hinging area in those portions where the film 11 is not fused to the substrate 12 such as indicated at 17 to afford a hinging feature as illustrated in FIG. 2.

The same elements are designated with the same numbers in the FIGS. 2-6 embodiments except in the instance where the elements have been modified in which case the same number is used except followed with a letter. These "fix-flex" units are particularly useful where it is desired to house a prefabricated circuit in an established housing.

Figure 2:
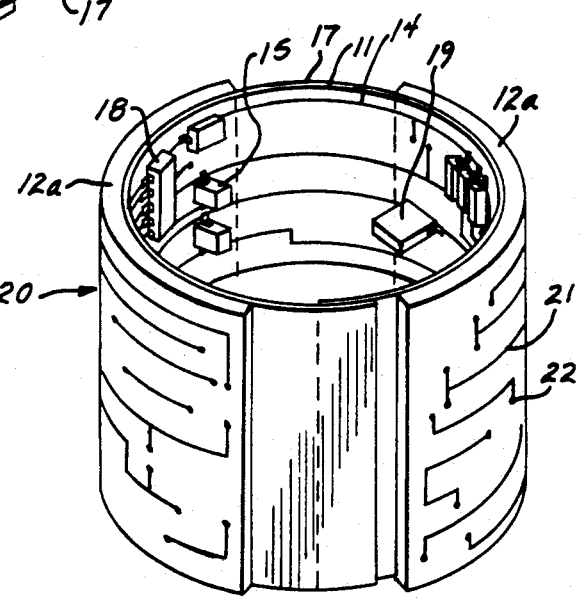
FIG. 2-4 are top perspective views of additional embodiments.

Referring to FIG. 2, the embodiment generally 20 utilizes the same flexible film 11. The difference in this embodiment is that the substrates 12a are curved rather than flat or straight as in FIG. 1. This allows the unit 20 to be easily placed in a rounded container such as an automotive steering column or various pieces of military hardware. It should also be noted that there are the conductive traces 21 placed on the substrates 12a opposite the flexible film 11. There are also the vias 22 which can interconnect the conductive traces 21 with the conductive traces 14 in the flexible film 11. The conductive traces 21 can be applied in the same manner as conductive trace material 14 and at the time of injection molding substrates 12a using the captured decal process of this inventory. Alternatively, the decal could be removed leaving the conductive traces on the molded substrates 12a or they could be applied by standard etching procedures. The vias 22 are preferably laser drilled.

Figure 3:
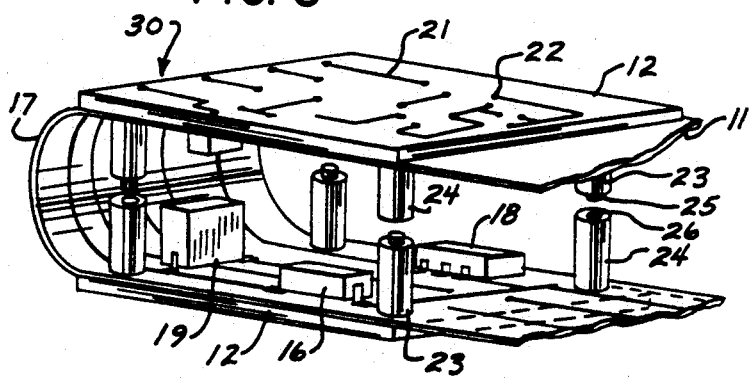

In FIG. 3, the "fix-flex" embodiment 30 is described with two rigid substrates 12 which are flat. Post members 23 and 24 having projections 25 and apertures 26 respectively extend from opposing substrates 12 for the purpose of locking them in a unitary manner into a fixed position. These post members can be injection molded to the film 11 and the substrates 12 such as later described in conjunction with FIG. 16. This embodiment would be especially useful where space is at a premium as would be the case in computer or telephone applications or where a solid rack application is desired.

Figure 4:
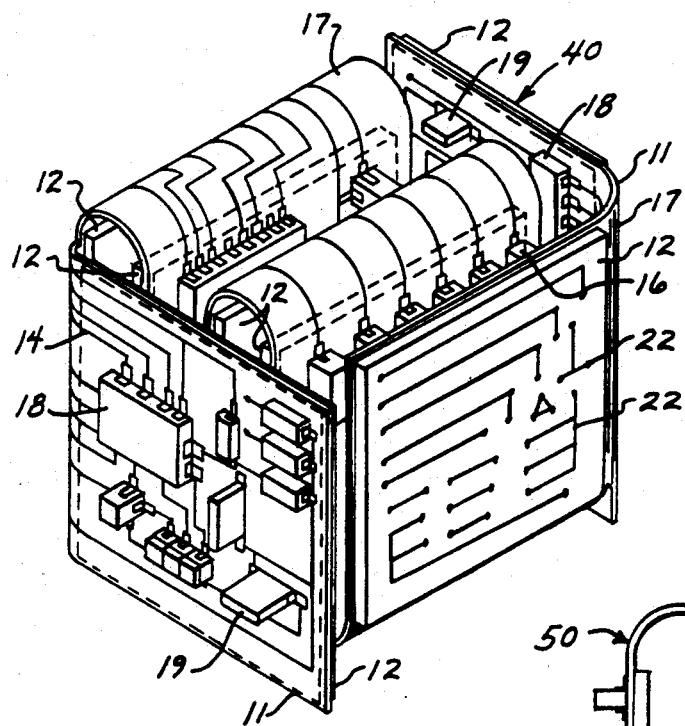
Figure 5:
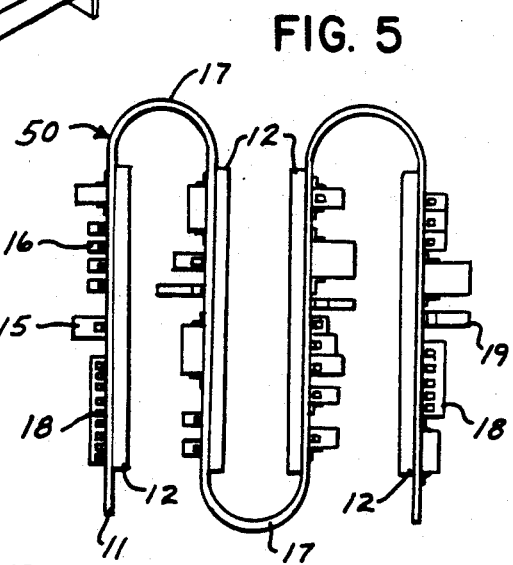
FIGS. 5 and 6 and top plan views of further embodiments.
Figure 6:
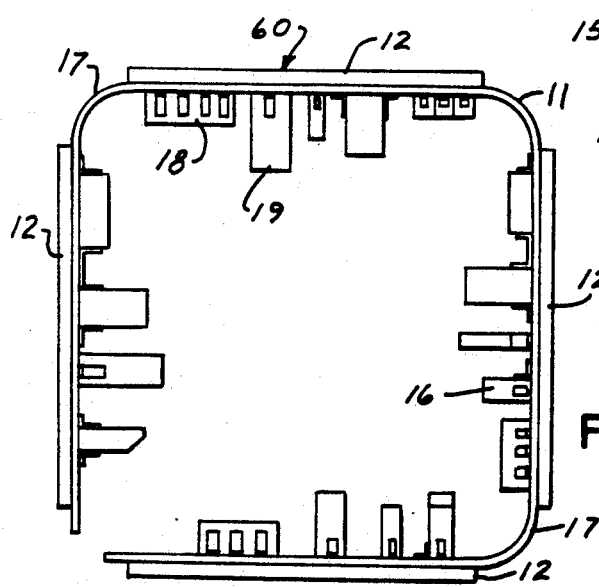

FIGS. 4-6 illustrate embodiments 40, 50 and 60 where the "fix-flex" circuit package is formed with different numbers and arrangements of the "fix-flex" units which are folded into different geometric configurations. FIGS. 4 and 6 show a box like configuration with FIG. 4 also showing the folded units inside the "box". In FIG. 5 a serpentine configuration is depicted. Note that the substrates 12 are positioned on opposing sides of the film 11.

Figure 7:
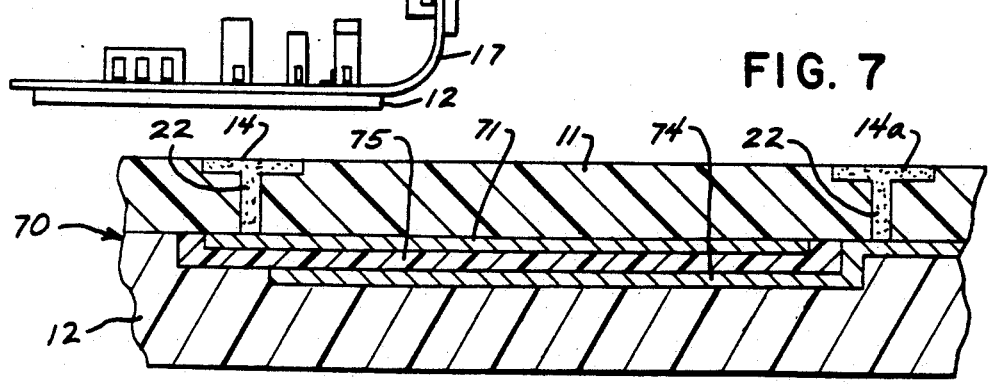
FIGS. 7 is a view in vertical section illustrating a capacitor molded in the printed circuit package of this invention.

In FIG. 7 there is shown generally a capacitor unit 70 which is embedded into the substrate 12. In this instance there is an electrode 71 which is printed on the film 11 in electrical contact with the circuit pattern 14 through the vias 22. A second electrode 74 is similarly connected with the circuit pattern 14a through the vias 22. An insulator 75 is printed between the electrodes 71 and 74.

FIG. 8 shows a filter, generally 80, which is printed onto the decal 11, prior to molding onto the substrate 12. In this instance the filter will have the usual filter pin 81 electrically connected to the conductive path 14. The electrodes 83 are electrically connected to a metalized passage 84. The intermediate ground electrodes 85 are connected to the circuit pattern 14a through the vias 22. The usual dielectric layer 86 is printed onto the decal 11 and separates the electrodes 83 and 85.

In FIG. 9 there is shown an inductor, generally 90. The inductor is also printed onto the carrier decal 11 and will include top conductors 91, connected to lower conductors 92. They are connected through the innerconnecting portion 93 to provide a helical configuration surrounding an annular ferrite ink portion 94.

METHOD FOR PRODUCTION

Figure 11:
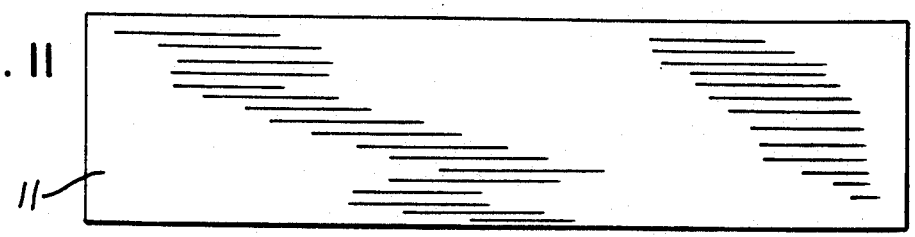
FIGS. 11-16 are diagrammatic views illustrating the steps in manufacturing a printed circuit package of this invention.
Figure 12:
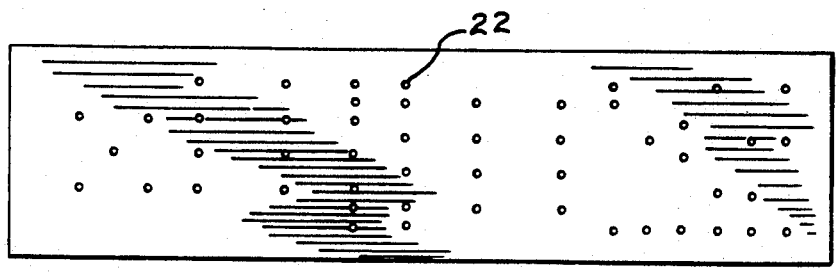

FIGS. 11-16 illustrate a typical method for producing the molded printed circuit packages of this invention. The flexible plastic film as shown in FIG. 11 is designated by the numeral 11 and in this instance is preferably 0.005 inch in thickness. The next step is to provide the vias openings 22 through the film 11 which is indicated in FIG. 12. They are preferably laser drilled therethrough.

Figure 13:
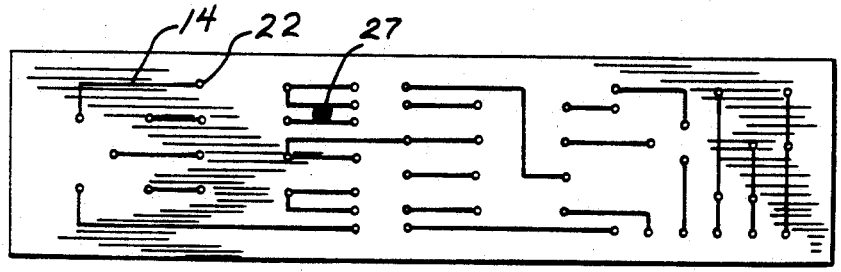

Referring to FIG. 13, on the film 11 will next be printed in the usual manner with the various electronic conductive paths 14 and any resistors 27. These conductive paths 14 permit a later deposition of resistor areas in contact therewith. The conductive paths 14 are preferably screen printed using a 200 mesh screen with a conductive plastic polymer thick film termination "ink" formulated essentially from a conductive material and a thermoplastic resin based butyrophenone and acetophenone solvent. The thermoplastic resin can be obtained from Amoco Oil Company as Polysulfone P3500 Natural. The conductive material in this case would be a "P" type silver powder available from Engelhard Industries mixed with Silflake 135 from Handy and Harmon.

Resistor areas 27 can be applied by depositing a layer of resistive material to preferably overlie the paths such as 14 and 14a. These resistor areas are also preferably screen printed with a 200 mesh screen and utilizing a resistance ink employing an identical thermoplastic resin based vehicle previously described and loaded with the desired amount of Vulcan Carbon XC-72R from Cabot Corporation combined with channel black carbon particles.

Figure 14:
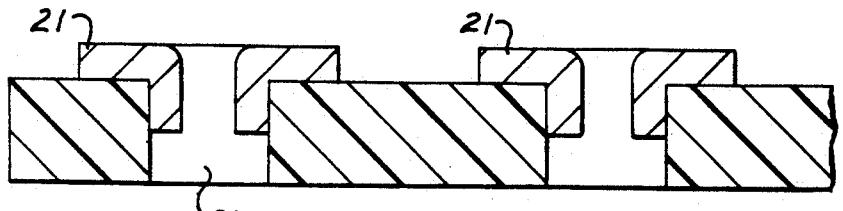
Figure 15:
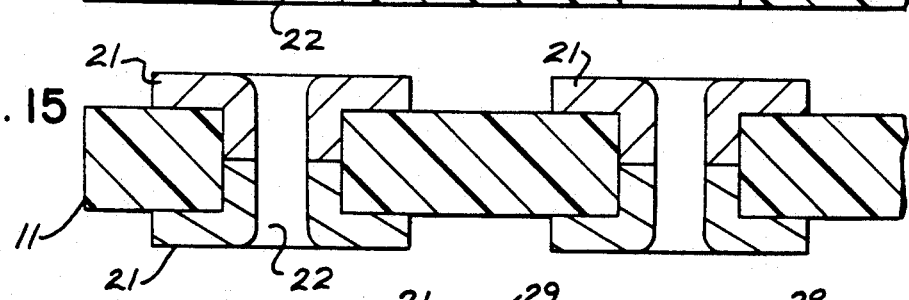

Referring to FIGS. 14 and 15, there is shown the lining of the vias opening 22 with the previously described conductive material which is shown at 21. This is the next step in the manufacturing process and is effected in two stages.

Figure 16:
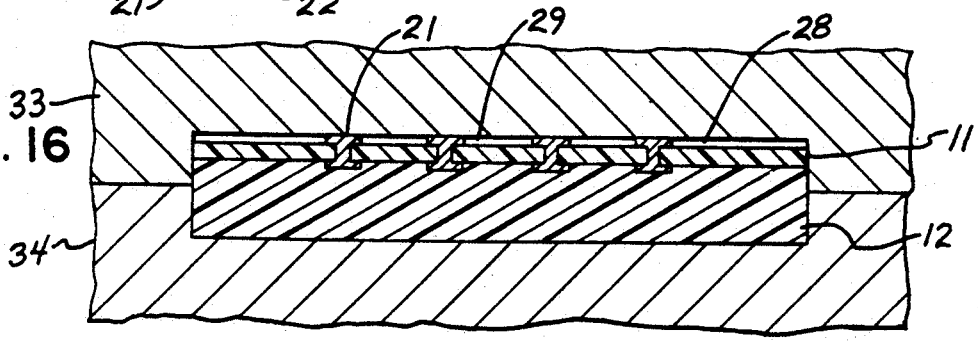

A subsequent step in the process is to integrally fuse the film 11 with the previously described conductive paths 21, 14, 14a and 21 as well as any resistors 27 with a molding material to form the molded printed circuit package with a substrate 12. This is shown in FIG. 16. As indicated therein, two mold halves as represented by 33 and 34 provide a cavity 28 for the film 11 and a plastic material having the capability of fusing with the film 11 is injected into the mold through the usual sprue. This is effected at the usual temperature and pressure for injection molding this particular material. In this instance the molding material is also an Ultem resin but is reinforced with 20-40% glass fiber as a filter. This will cause a fusing of the film 11 into the molding material to thereby result in an integrally molded product of one piece construction. At this stage the post members 23 and 24 of embodiment 30 can also be molded to the substrate 12 and the film 11 by providing suitable cavities in the mold half 33. As the molding material is forced into the cavity 28, the film 11 is forced against the hot cavity wall 29. The conductive paths 14, 14a and 21, and the resistor 27 are thereby embedded into the film 11 and in the instance where they are positioned face-up in the mold half 33 this results in a coplanar or flush condition with the surface of the film.

Concerning the embodiments 10, 20, 30, 40, 50 and 60, the various components such as the transistors 15, the resistors 16, the dual inline network 18 and the capacitors 19 can be machine applied to the fused film 11. This would be effected as by commercially available pick and place equipment.

As to the capacitor 70 shown in FIG. 7, the film 11 would be printed with the electrodes 71 and 74 and the dielectric material 75 in a layering procedure. The electrodes would be composed of the same material as previously indicated for the conductive paths 14 whereas the dielectric material 75 would be composed of a ceramic-polymer ink produced by first sintering a high dielectric constants (K-10,000) material which is a barium titanate composition. This material is commercially available from the Dimat Company in Cedarburg, Wis. After firing the ceramic to a full firing temperature of 1250° C., the sintered material is reground by crushers and a wet ball mill to a submicron particle. Subsequently, the ceramic powder is fully dried.

The dried ceramic powder is mixed with the previously described polymer ink system to form a printable and moldable ink material. The dielectric constant of the printable ink will be approximately K 100. The inks for the electrodes 71 and 74 and the dielectric material 75 are printed on the decal film 11 by standard layering processing. The dried film thickness will be between 0.0005" to 0.001" thick. The film 11 would be placed in the mold halves 33 and 34 as indicated in FIG. 16, except the electrodes 71 and 74 would be positioned facing the bottom mold half 34. The capacitor will have a performance like Z5U characteristic. This same printing of the electrodes 83 and 85, as well as the dielectric material 86 and positioning of film 11 and the electrodes 83 and 85 toward the bottom mold half 34 would apply with respect to the molding of the filter unit 80. The electrodes 83 and 85 are composed of the same materials as electrodes 71 and 74, and the dielectric material 86 is the same as insulative material 75.

Turning to the inductor 90 and its fabrication, the conductors 91, 92 and 93 are composed of the same material as the electrodes 71 and 74. Conductor 92 would first be printed on the film 11 followed by the printing of the ferrite ink portion 94 which is composed of the same material as described for the dielectric material 75 except the material is a soft ferrite such as available from the Allen-Bradley Co. as W-01. It is fired at 1100° C. and processed in the same previously described manner. Subsequently, the conductor 93 is printed and then conductor 91. The film 11 would be molded in a manner as previously indicated such that the conductor 91 would face the upper mold half 33. This would cause the conductors 91-93 to be embedded into the film 11 with the conductor 91 flush with the upper surface of the film 11. Obviously, other configurations for the inductive component 90 could be used where an inductive function would be required such as high frequency filters.

In the previous description, certain particular resinous plastics were indicated for use in composing the film material as well as the injection molded substrate material for fusing with the film. It is obvious that various combinations of plastic materials for the film and the molding substrate composition could be utilized and these would not necessarily have the same chemical composition. The requirement is that they have chemical compatability for fusing the film with the substrate and possess the necessary properties for encapsulating or surrounding electrical components. If desired, film materials other than plastic could be used for the flexible film 11 such as treated paper, copper or other metallic film.

It will thus be seen that the present invention provides a product which lends itself to high speed film printing together with automatic injection molding so that mass production can be obtained with low cost. In this manner circuit boards can also be produced having three-dimensional designs. All the components produced are rugged and can be made with a high circuit density, hybrid system. With the film and substrates being made of compatible plastic, good expansion coefficiencies can be achieved as well as protection from the environment. Versatility is also afforded in that if desired a heat dissipation function can be incorporated into the resulting printed circuit board. Further, passive as well as active components can be incorporated into the printed circuit board, and there is also the capability to produce a multilayer board. All of the above is accomplished with improved performance of interconnection with the molded vias openings. Still further advantages are in the fact that the components of this invention lend themselves to packaging of the circuits.

The embodiments of the invention of which an exclusive property or privilege is claimed are defined as follows:

I claim:

1. A moulded electrical circuit package wherein an entire support member is secured to a substrate comprising:
   a support member composed of a thin flexible film material having an electrically conductive circuit trace material disposed on one side of said support member;
   an electrical component unitarily disposed on said flexible support member, said electrical component having at least two layers of conductive material;
   a substrate material; and
   said substrate material and said flexible support member being moulded directly together to form a unitary structure, with said support member and said substrate material defining separate portions in said moulded circuit package and said electrically conductive circuit trace material being embedded in said thin flexible support member and flush with the surface thereof when disposed on a surface opposite said substrate material.

2. The electrical circuit package as defined in claim 1 wherein said electrical component is a capacitor.

3. The electrical circuit package as defined in claim 1 wherein said electrical component is a filter.

4. The electrical circuit package as defined in claim 1 wherein said electrical component is an inductor.

5. The electrical circuit package as defined in claim 1 wherein said unitary structure has a three-dimensional configuration.

* * * * *